(12) United States Patent
Chee et al.

(10) Patent No.: US 7,061,123 B1
(45) Date of Patent: Jun. 13, 2006

(54) WAFER LEVEL BALL GRID ARRAY

(75) Inventors: Lee Cheong Chee, Melaka (MY); Sri Ganesh A. L. A. Tharumalingam, Melaka (MY)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/838,899

(22) Filed: May 3, 2004

(51) Int. Cl.
     *H01L 23/48* (2006.01)
(52) U.S. Cl. .................. 257/778; 257/777; 257/782; 438/613
(58) Field of Classification Search .................. None
See application file for complete search history.

(56) References Cited

U.S. PATENT DOCUMENTS 5,620,928 A    4/1997   Lee et al.

| | | | |
|---|---|---|---|
| 2004/0033673 A1* | 2/2004 | Cobbley et al. | 438/455 |
| 2004/0127011 A1* | 7/2004 | Huang et al. | 438/613 |
| 2005/0082682 A1* | 4/2005 | Liu | 257/778 |
| 2005/0133935 A1* | 6/2005 | Vasishta et al. | 257/782 |

* cited by examiner

*Primary Examiner*—Dung A. Le
(74) *Attorney, Agent, or Firm*—Beyer Weaver & Thomas, LLP

(57) ABSTRACT

A manufacturing technique that involves embedding one or more semiconductor die into a support substrate and forming conductive traces that lead from die contact pads to redistributed contact pads on the support substrate. Active surfaces of the dice and a working surface of the support substrate are substantially coplanar and the conductive traces are formed on the coplanar surfaces. The redistributed contact pads are sufficiently spaced apart from each other so that conductive balls can be formed thereon. Individual semiconductor device packages are singulated from the support substrate.

14 Claims, 8 Drawing Sheets

WAFER LEVEL BALL GRID ARRAY

FIELD OF THE INVENTION

The present invention relates generally to semiconductor device packages, and more specifically to ball grid array semiconductor device packages.

BACKGROUND

In the field of integrated circuit packaging, the cost and size of the overall package are major concerns. Any reduction in the cost of producing the package or reduction in the size or thickness of the package can provide a significant commercial advantage. To this end, the packaging of integrated circuits is continuously being improved to provide higher performance and more cost effective integrated circuit packages.

There are currently several types of Ball Grid Array (BGA) packages currently available. These types include the Plastic Ball Grid Array (PBGA), the Ceramic Ball Grid Array (CBGA), and the Tape Ball Grid Array (TBGA). The PBGA and the TBGA are the thinnest ball grid array packages currently available. Referring to FIG. 1, a side plan view of a typical BGA integrated circuit package 10 will be described. Package 10 includes a dielectric substrate 12 an integrated circuit die 14, an array of bonding wires 16, an encapsulating material 18, and an array of contacts or solder balls 20.

As shown in FIG. 1, substrate 12 has a top surface 22, a bottom surface 24, a plurality of electrically conductive terminal pads 26 on the top surface 22 of substrate 12, a plurality of contact terminal pads 28 on the bottom surface 24 of substrate 12, and a plurality of electrically conductive traces (not shown). Each of the electrically conductive traces interconnects a respective one of terminal pads 26 on the top of substrate 12 to an associated contact terminal pad 28 on the bottom of substrate 12. Substrate 12 is made from a rigid material capable of supporting the other components of the package during the assembly of the package. Substrate 12 can be made of a material such as Polyvinyl Chloride (PVC). Integrated circuit die 14 has a top surface 30, a bottom surface 32, and includes a plurality of input/output terminals 34 on its top surface 30. Each of the bonding wires 16 electrically connect a respective one of terminal pads 34 to an associated terminal pad 26 on the top surface of substrate 12. Bonding wires 16 are wirebonded between terminal pads 34 of integrated circuit die 14 and terminal pads 26 through techniques that use ball and wedge bonds. Encapsulating material 18 encapsulates integrated circuit die 14, at least the top surface of substrate 12, and bonding wires 16. Contacts or solder balls 20 are attached to associated contact terminal pads 28 thereby allowing external electrical elements to be electrically connected to integrated circuit die 14. This arrangement represents the typical prior art PBGA integrated circuit package.

As is commonly understood, the surface area of die 30 is not large enough to allow multiple, individual conductive balls to be formed on its input/output contact pads. Therefore, dielectric substrate 12 is used to connect the closely spaced input/output contact pads of die 30 to contacts or solder balls 20 that are sufficiently spaced apart on the larger bottom surface 24 of dielectric substrate 12. In this way, package 10 can be conveniently attached to an external electrical system such as a printed circuit board through the contact 20.

Unfortunately, substrate 12 presents various cost and performance inefficiencies. First of all, the cost of PVC is a major cost driver for manufacturing BGA packages. Second, the distance that each of the electrically conductive traces travel within substrate 12 tends to be large enough to cause a noticeable decrease in system performance, especially at high frequencies. The length of each electrically conductive trace is large because each trace runs from a terminal pad 34 on the top surface 22, through the body of substrate 12, and then terminates at one of terminal pads 28 on bottom surface 24 of substrate 12. Third, substrate 12 typically can contain only a relatively low density of internal electrically conductive traces, which limits the maximum number of input/output contact points for integrated circuit package 10. Furthermore, the manufacturing yield of the substrates is low due to difficulties with forming the conductive traces within the body of the substrates. Finally, the manufacturing costs of substrates are high due to the need manufacture specific substrates to match the various sizes of integrated circuit dice.

Bonding wires 16 are another source of cost and performance inefficiencies for BGA packages because of the inaccuracy of wire bonding techniques, the space occupied by the bonding wires, and the likelihood of bonding wires 16 to become disconnected. The wire bonding processes also have occasional problems such as when wires do not properly attach to a contact point. Bonding wires can also get "washed" during an injection molding process where wires are pushed down, are pushed into contact with each other, or pushed into other problematic positions.

BRIEF SUMMARY OF THE INVENTION

The present invention is directed to a manufacturing technique that involves embedding one or more semiconductor die into a support substrate and forming conductive traces that lead from die contact pads to redistributed contact pads on the support substrate. Active surfaces of the dice and a surface of the support substrate are substantially coplanar and the conductive traces are formed on the coplanar surfaces. The redistributed contact pads are sufficiently spaced apart from each other so that conductive balls, which form contact points, can be formed on them. The redistributed contact pads form alternate contact pads to the die contact pads, which are too closely positioned to each other to support conductive ball contacts.

As a method, the present invention involves at least molding a plurality of semiconductor dice within a support substrate wherein an active surface of each die is exposed through a working surface of the support substrate, the active surface of each die having a plurality of die contact pads, forming conductive traces upon the active surfaces of the dice and the working surface of the support substrate wherein a first end of each conductive trace connects to a respective die contact pad and a second end of each conductive trace forms a redistribution contact pad, and singulating each semiconductor device from the support substrate wherein each semiconductor device includes at least one semiconductor device, a portion of the support substrate, and at least one conductive trace. In one implementation of the method, the conductive traces are formed using photolithographic techniques. In another implementation, the operation of forming conductive traces forms each of the conductive traces substantially within a single plane.

As a semiconductor device, the present invention includes at least a semiconductor die having an active surface and at least one die contact pad formed on the active surface, a substrate having a working surface, the substrate being formed about the die such that at least a portion of the active surface of the die is exposed through the substrate and is adjacent to and substantially coplanar with the working surface of the substrate, and a conductive trace having a first end that is formed upon the active surface of the die and that is connected to a die contact pad and a second end formed upon the working surface of the substrate and forming a redistribution contact pad.

As a semiconductor manufacturing component, the present invention includes at least a plurality of semiconductor dice that each have an active surface, each active surface having a plurality of die contact pads, a substrate having a working surface, the substrate being formed about each die such that the active surface of each die is exposed through the substrate and is substantially coplanar with the working surface of the substrate, and a plurality of conductive traces that each have a first end that is formed upon the active surface of a respective die and that is connected to a die contact pad and a second end formed upon the working surface of the substrate and forming a redistribution contact pad.

These and other features and advantages of the present invention will be presented in more detail in the following specification of the invention and the accompanying figures, which illustrate by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known operations have not been described in detail so not to unnecessarily obscure the present invention.

The present invention pertains to semiconductor device packages having conductive ball contacts and to techniques for manufacturing such devices. The manufacturing technique involves embedding one or more semiconductor die into a support substrate and forming conductive traces that lead from contact pads upon each die to redistributed contact pads formed on the support substrate. Active surfaces of the dice and a surface of the support substrate are substantially coplanar and the conductive traces are formed on the coplanar surfaces. The redistributed contact pads are sufficiently spaced apart from each other so that conductive balls, which form the ball contacts, can be formed on them. The redistributed contact pads form alternate contact pads to the contact pads on each die, which are too closely positioned to each other to support conductive ball contacts. In one embodiment, the conductive traces are formed using photolithographic techniques. The packaged devices of the present invention have high structural integrity and high interconnect trace density.

Figure 1:
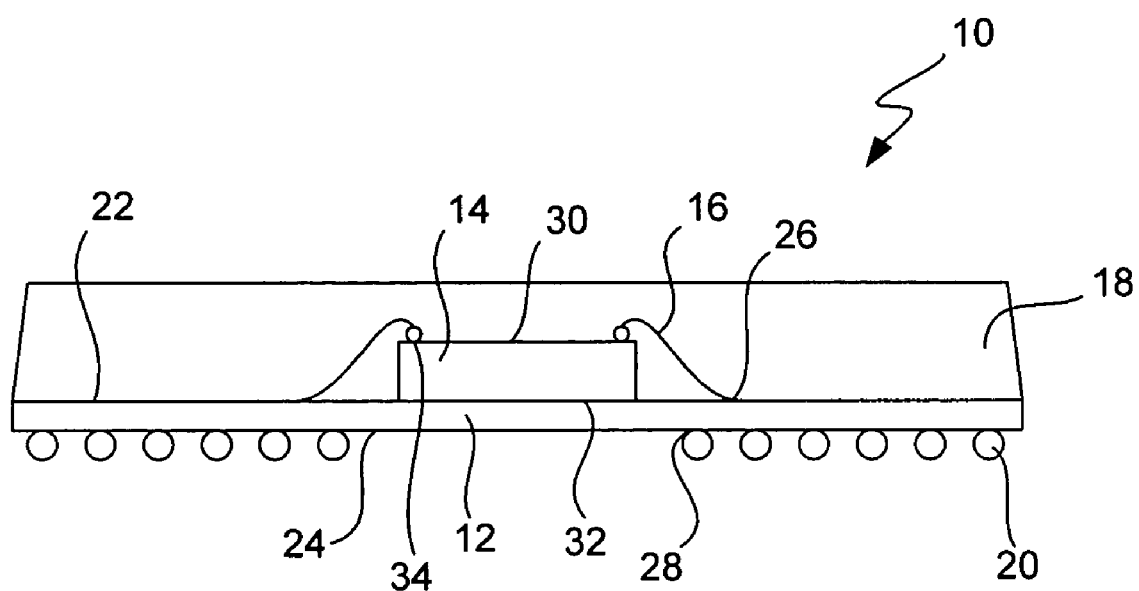
FIG. 1 illustrates a side plan view of a typical ball grid array integrated circuit package.
Figure 2:
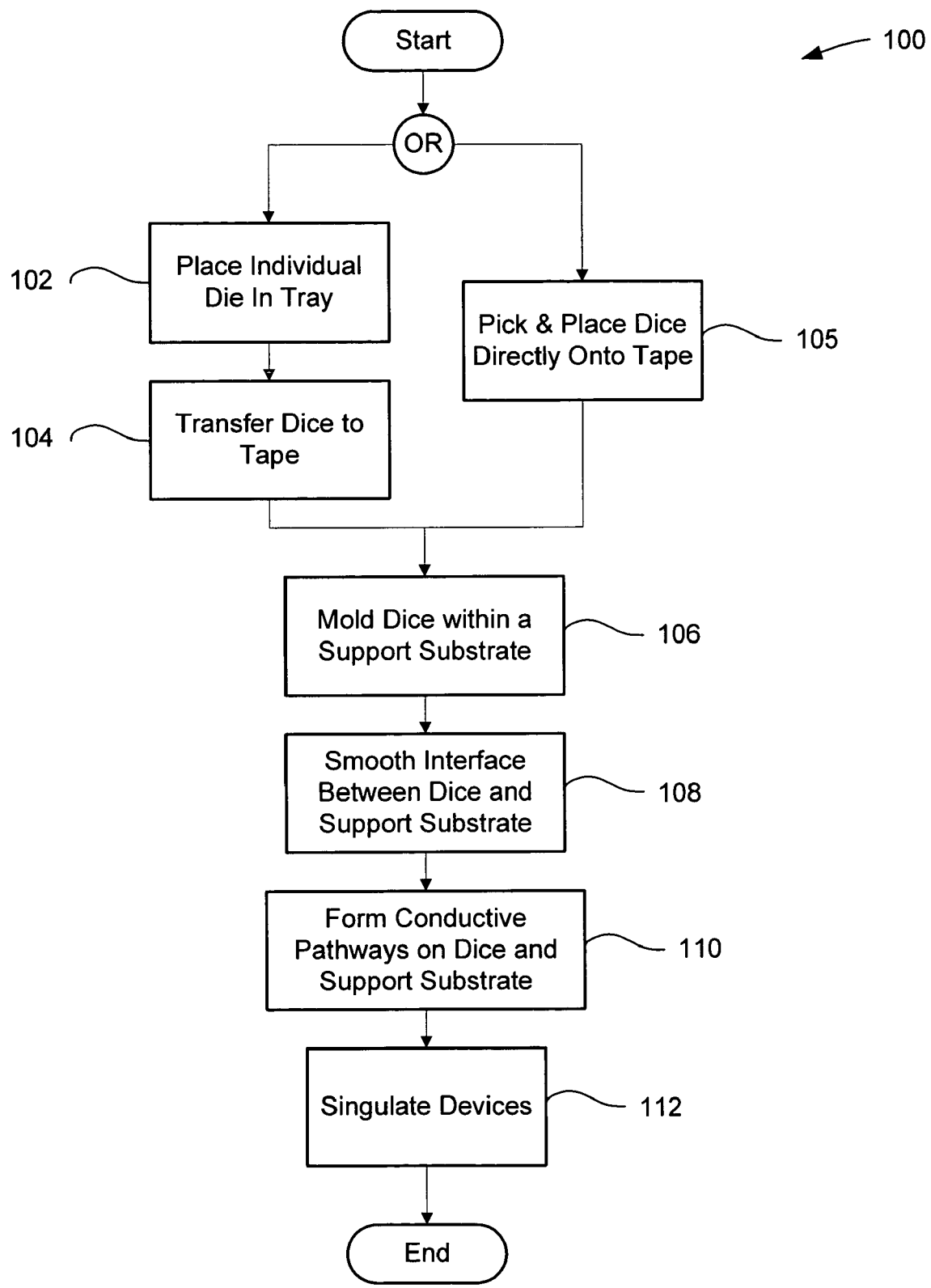
FIG. 2 illustrates a flow diagram of a method for manufacturing semiconductor devices according to one implementation of the present invention.
Figure 3:
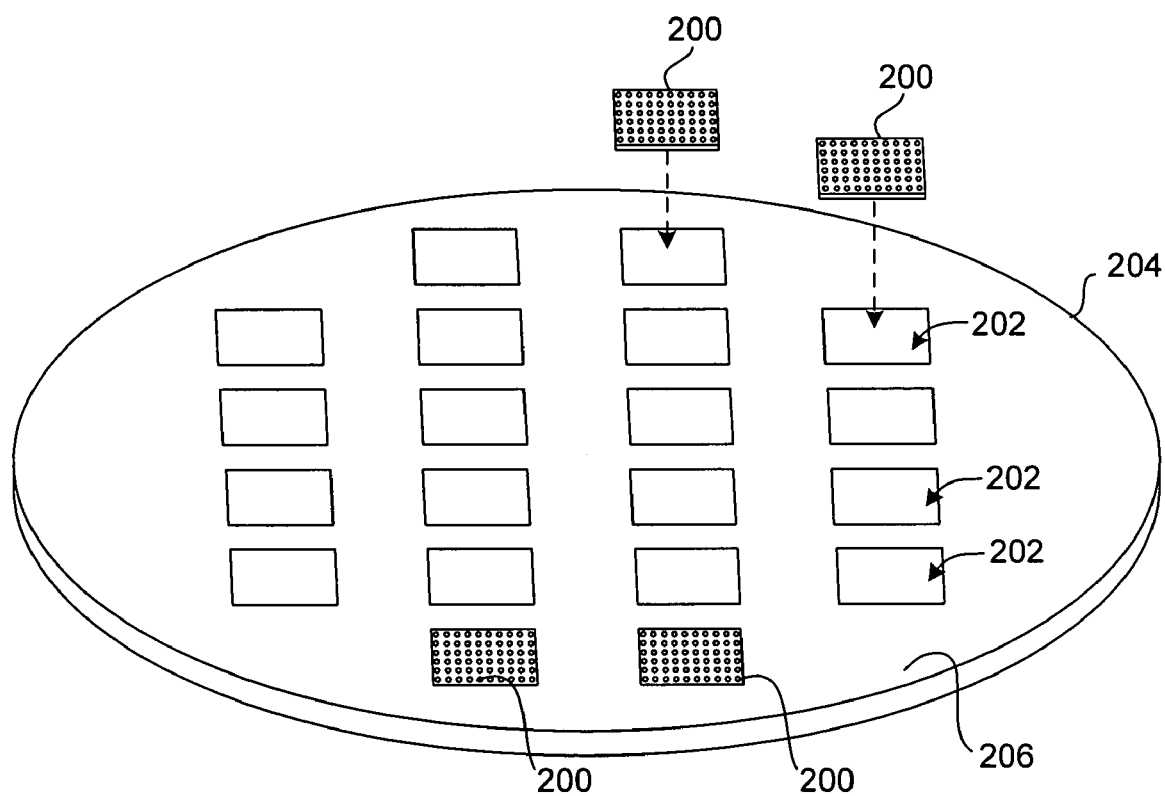
FIG. 3 illustrates a perspective view of semiconductor dice that are being placed within a tray.

The following description will describe the inventive manufacturing technique and the state of the semiconductor device packages throughout each stage of the technique. FIG. 2 illustrates a flow diagram of a method 100 for manufacturing semiconductor devices according to one implementation of the present invention. FIGS. 3–8 illustrate the state of the semiconductor device packages throughout certain stages of the manufacturing technique. Method 100 for manufacturing the devices of the present invention begins with block 102. FIG. 3 illustrates the process of block 102 with a perspective view of semiconductor die 200 that are being placed within a tray 204.

In block 102, individual semiconductor dice 200 are placed within a pocket 202 of a tray 204. The purpose of block 102 is to position dice 200 in an arrangement suitable for molding a support substrate around each of the dice 200. As is commonly understood, the individual dice 200 are obtained through a semiconductor device manufacturing process wherein the dice are mass-produced in wafer form and then singulated into individual die 200. Tray 204 has multiple pockets 202 for receiving and securing each die 200 in a desired position. As shown in FIG. 3, pockets 202 are arranged in an array of rows and columns. The number of pockets 202 within tray 204 and the arrangement of pockets 202 can vary depending upon, among other factors, the number and size of dice 200 to be placed into tray 204 and the size of tray 204.

Semiconductor dice 200 have an active or top surface and a bottom surface. The active surface contains input/output contact pads or bond pads for electrical connection to external electrical devices. Dice 200 are placed in pockets 202 with their respective active surfaces exposed so that dice 200 are in an orientation amenable for proceeding with the next stage of the manufacturing process 100. With respect to FIG. 3, the active surfaces of dice 200 are facing upwards so that they remain exposed after placement into pockets 202. In the next stage, an adhesive tape will need to be adhered to the active surfaces of each die 200.

Pockets 202 of tray 204 are arranged in a wafer shape so that dice 200 can be embedded within a wafer shaped substrate, which will allow the manufacturing technique 100 to utilize standard semiconductor manufacturing systems. Pockets 202 of tray 204 can arrange dice 200 in various wafer sizes that conform to any of the standard wafer sizes used in semiconductor manufacturing techniques. In alternative embodiments, tray 204 can have various sizes and shapes, such as rectangular, oval, and the like. Tray 204 can be formed from various materials such as plastic and other dielectric materials.

Pockets 202 are sized to securely hold each die 200. Pockets 200 can have various structural elements for securing each die 200. For example, as shown in FIG. 3, each pocket 200 has edges that conform to the outline shape of each die 200. In alternative embodiments, each pocket 200 has prongs or individual supporting arms that secure die 200. Pockets 202 can be raised above, co-planar with, or depressed below the upper surface 206 of tray 204. Pockets 202 are spaced apart from each other so that in later stages of the manufacturing process, the distance between each die 200 can be occupied by a support substrate. The support substrate will support contact pads that are redistributed from each die 200. The distance at which each pocket 202 is separated from each other depends upon the number of redistributed contact pads about each die 200 and the spacing required by the redistributed contact pads.

Figure 4:
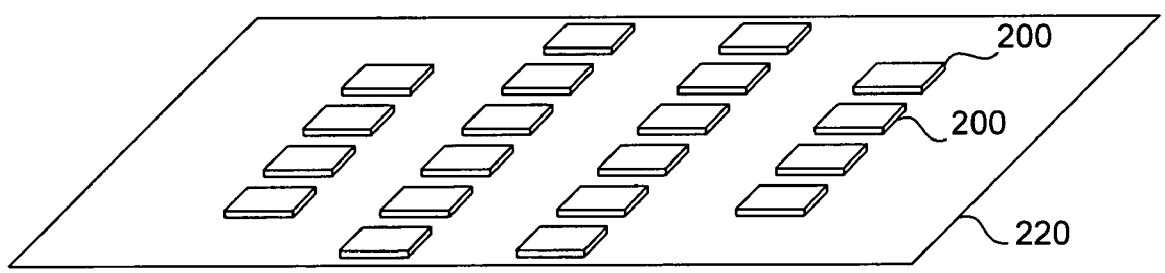
FIG. 4 illustrates a perspective view of an adhesive tape having attached dice according to an implementation of the present invention.

The next stage of process 100, which is block 104, is illustrated by FIG. 4. FIG. 4 illustrates a perspective view of an adhesive tape 220 having attached dice 200 according to an implementation of the present invention. Block 104 involves transferring individual die 200 onto an adhesive tape 220. Dice 200 are transferred to tape 220 by applying tape 220 to the active surface of dice 200. For instance, tape 220 is placed over tray 204 with the adhesive side of the tape 220 facing towards each of dice 200. After each die 200 adheres to tape 220, tape 220 and dice 200 are removed from tray 204. In some embodiments, tray 204 secures each of die 200 with enough force that tray 204 can be flipped over and placed onto adhesive tape 220 in order to transfer dice 200 to tape 220. After dice 200 have been transferred to tape 220, tray 204 is no longer needed in manufacturing process 200. As seen in FIG. 4, dice 200 are placed onto tape 220 in the orientation dictated by tray 204. Specifically, each die 200 is separated from each other with the spacing dictated by tray 204. Note that the bottom surface of each die 200 faces upwards since the active or top surface of each die 200 faces downwards and is in contact with tape 220.

In an alternative implementation of method 100, dice 200 are picked and placed directly onto an adhesive tape as represented in block 105. The process of block 105 does not utilize tray 204. For instance, a pick and place device can place dice 200 onto tape 220 in a desired arrangement, such as the arrangement shown in FIG. 4. In other implementations of the present invention, dice 200 can be placed in various patterns so long as space is provided between each die for forming a support substrate and its respective conductive traces.

Figure 5:
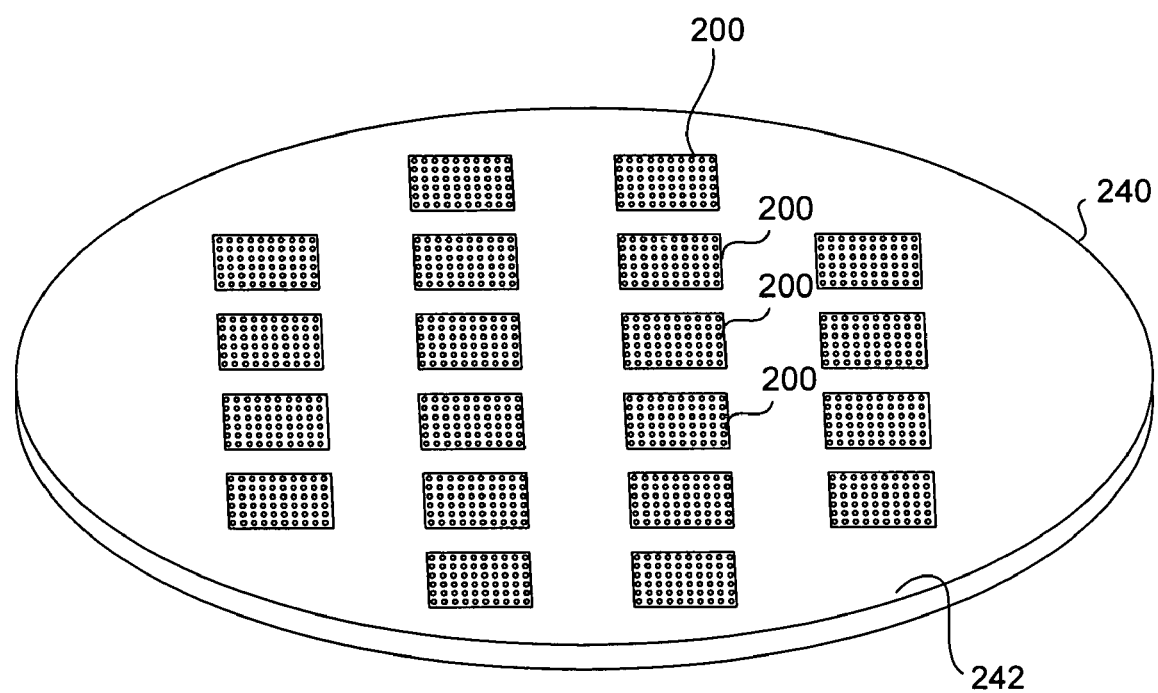
FIG. 5 illustrates a perspective view of a support substrate that contains an array of embedded dice, according to one embodiment of the present invention.

The next stage of process 100, which is block 106, involves molding dice 200 within a support substrate. FIG. 5 illustrates a perspective view of a support substrate 240 that contains an array of embedded dice 200, according to one embodiment of the present invention. Dice 200 can be molded within a support substrate using various techniques. One technique involves placing tape 220 and its attached dice 200 into a molding system. For instance, tape 220 and dice 200 are placed within a molding chamber, which is then filled with liquid molding material. After the molding material is cured, tape 220, dice 200, and the molded support substrate 240 are removed from the molding system. Support substrate 240 takes on the shape of the molding chamber, which can be in the shape of a wafer as shown in FIG. 5. Support substrate 240 encapsulates the side surfaces and bottom surfaces of each die 200. After tape 220 is removed from substrate 240, the active surfaces of each die 200 are revealed to be exposed through the top or working surface 242 of support substrate 240. Essentially, dice 200 are now supported within support substrate 240.

Working surface 242 is substantially coplanar with the active surface of each die 200. Working surface 242 also surrounds the outer perimeter of each die 200 such that working surface 242 and the active surface of each die 200 meet at a flat, smooth, and seamless interface. Ideally, the interface between each die 200 and the working surface 242 surrounding each die 200 is smooth and flat. A smooth interface allows conductive, interconnecting traces to be run from a die 200, across the interface without breakage, and to a location upon working surface 242. However, in some cases, the interface between each die 200 and the support substrate 240 might not be perfectly smooth. For instance, the molding material may not have completely surrounded each die 200 so that a crack exists between support substrate 240 and one or more of die 200.

Figure 7:
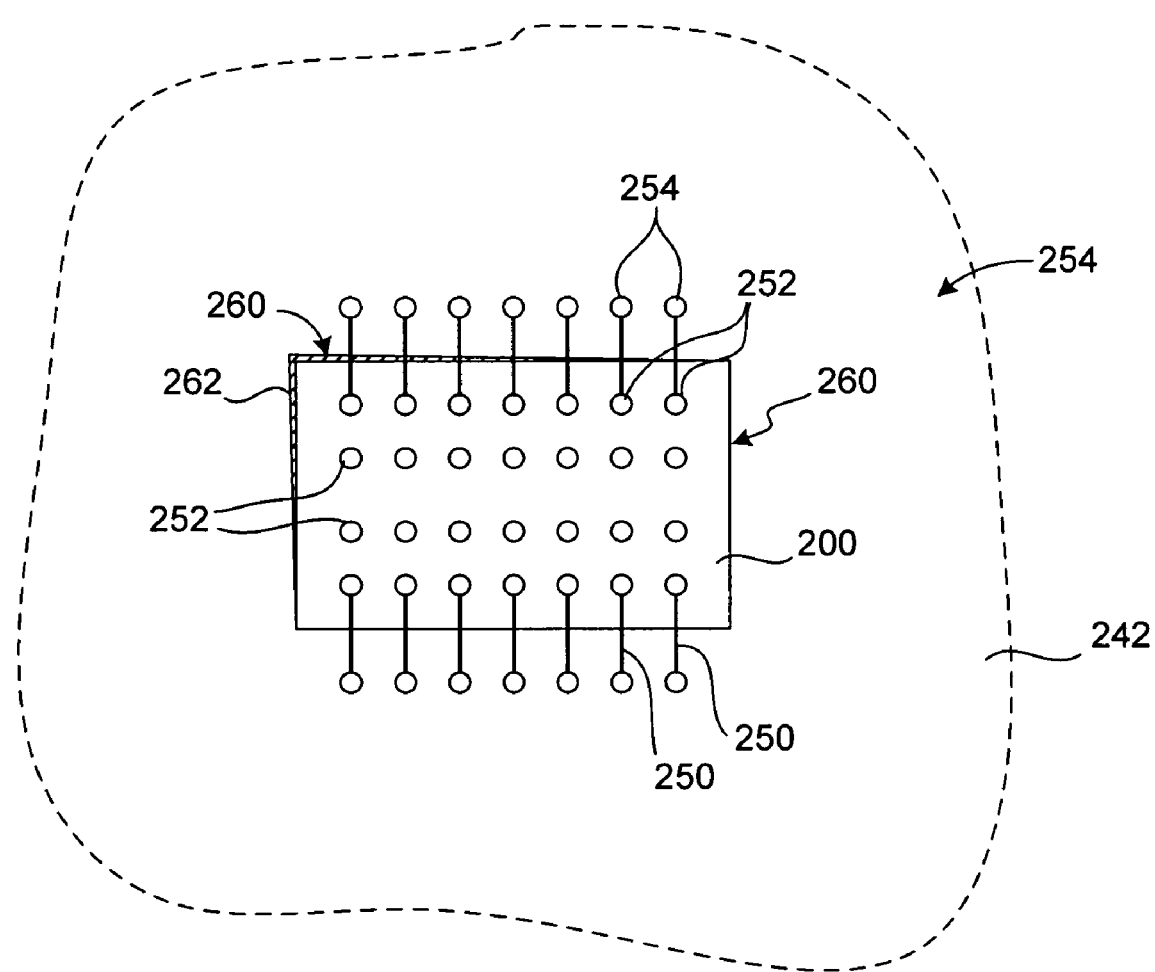
FIG. 7 illustrates a top plan, enlarged view of a single semiconductor device package that is still part of a support substrate.

Block 108 represents the stage of process 100 where a filler material is used to fill in any cracks between a die 200 and working surface 242. FIG. 7 illustrates a top plan, enlarged view of a single semiconductor device package 256 that is still part of a support substrate 240. As seen in FIG. 7, a semiconductor die 200 is surrounded by working surface 242 of support substrate 240. Note that die 200 and working surface 242 meet very tightly with each other along the right and bottom edges of die 200 so that the interface 260 is substantially seamless. The edges of the active surface of die 200 and working surface 242 of substrate 240 should also be substantially at the same height so that they are coplanar with each other. As shown along the top and left edges of die 200, sometimes the edges of die 200 and working surface 242 do not meet up and make contact with each other. In such regions of interface 260, a filler material 262 is used to fill in the crack or gap between the edges of die 200 and working surface 242. The filler material should be leveled off so that the interface between a die 200 and the surrounding working surface is substantially flat and smooth. The filler material can be, for example, epoxy, polyimide, or Benzo-cyclo-butene (BCB) by The Dow Chemical Company.

In an alternative implementation of block 106, a stencil is placed onto adhesive tape 220 and around the arrangement of dice 200. Then a molding material can be poured into the opening of the stencil. The stencil has a height that is equal to or larger than the thickness of dice 200. A squeegee process can be used to remove the excess molding material from the stencil. After allowing the molding material to cure, the stencil and tape 220 are removed to obtain a support substrate 240 as shown in FIG. 5 wherein the active surfaces of each die 200 are exposed through the working surface 242 of substrate 240. Other molding processes can also be used to create the support substrate 240.

Although support substrate 240 typically takes on the form of a wafer, support substrate 240 can also be formed into various shapes such as rectangular, oval, and the like. Support substrate 240 has a thickness at least as thick as each of die 200 and in some instances is thicker than each die 200 to provide structural integrity to substrate 240. In other instances, support substrate 240 can have its bottom surface, which is the surface opposite to working surface 242, grinded down in order to reduce the thickness of the semiconductor device packages that will result from the manufacturing process.

The molding material can be a variety of materials such as a plastic, polyimide or an epoxy based material. The molding material should also have a low coefficient of thermal expansion (CTE) or a CTE that matches that of the silicon semiconductor dice 200. Such a CTE will reduce the likelihood that each die 200 will separate from the support substrate material during normal operation. The use of support substrate 240 represents an economical technique for redistributing contact pads for forming solder balls since the material and the process for forming substrate 240 is widely used and has been proven to be cost effective. This is especially true in comparison to the use of conventional substrates that have internal, conductive pathways that connect contact pads on opposing surfaces of such substrates.

Figure 6:
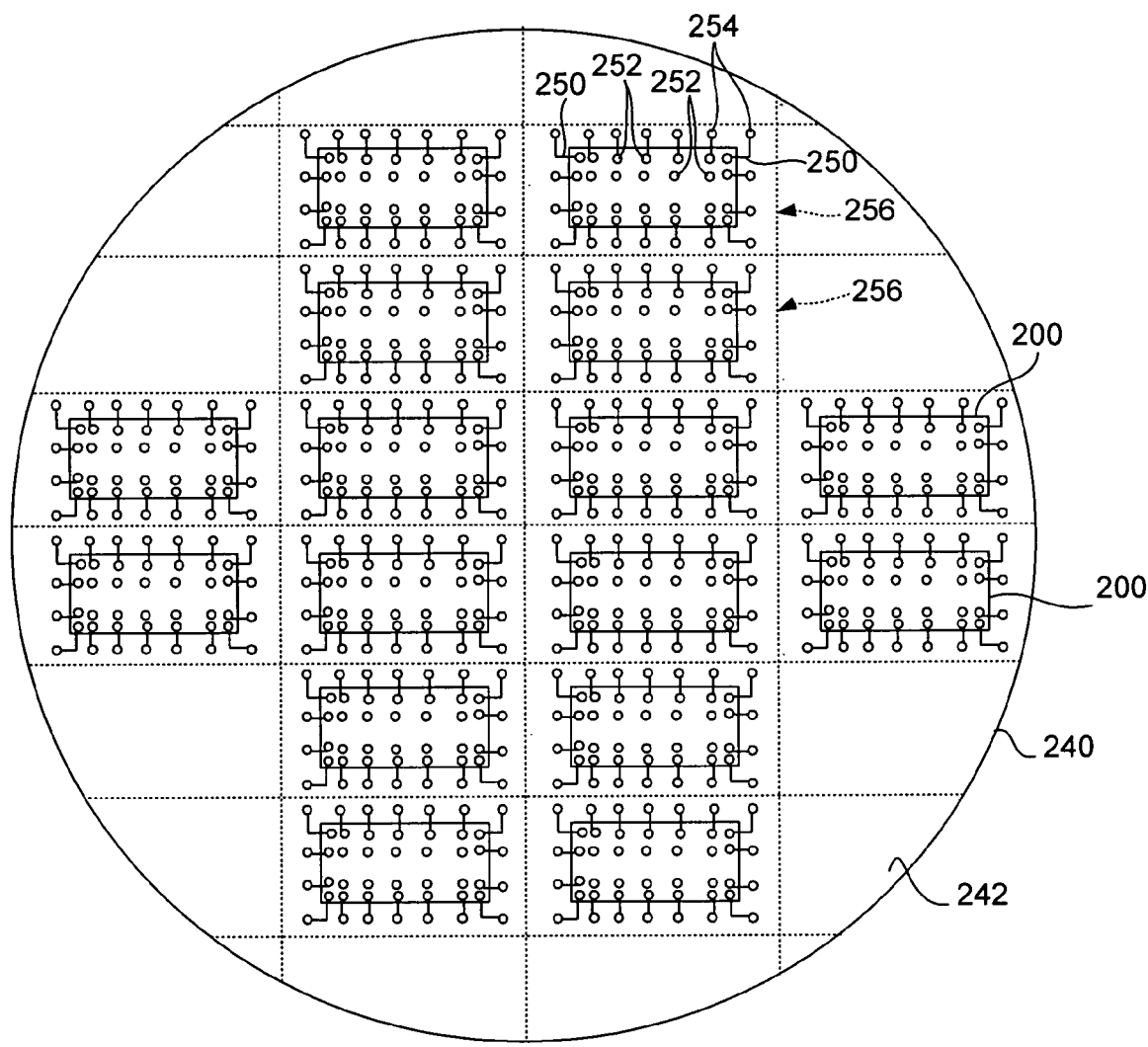
FIG. 6 illustrates a top plan view of a support substrate where conductive traces are formed upon the active surface of dice and the working surface of the support substrate.

Block 110 represents the next stage of manufacturing process 100 where conductive pathways are formed on each of die 200 and the working surface 242. FIG. 6 illustrates a top plan view of a support substrate 240 where conductive traces 250 are formed upon the active surface of dice 200 and the working surface 242 of support substrate 240. Manufacturing process 100 positioned each die 200 sufficiently far away from each other so that sufficient surface area on working surface 242 would be available to form conductive traces 250. The dashed lines in FIG. 6 delineate the surface area designated for each semiconductor device package 256 within support substrate 240.

Each of conductive traces 250 are thin pathways of conductive material that connect to an input/output contact (or bond) pad 252 of die 200 and have an opposite end that forms a redistributed contact pad 254. Conductive traces 250 typically run from a die contact pad 252 on the active surface of a die 200, across the interface between die 200 and the adjacent working surface 242 of support substrate 240, and terminates as a redistribution contact pad 254 on working surface 242. Redistribution contact pads 254 are positioned apart from each other with enough separation so that conductive balls such as solder balls can be formed on each redistribution contact pad 254. Specifically, the separation between adjacent redistribution contact pads 254 is large enough so that a manufacturing technique can be used to deposit conductive balls on redistribution contact pads 254 and so that the conductive balls, after being formed, can stand alone without contact with an adjacent conductive ball.

Conductive traces 250 can follow various paths, whether straight, curved, or bent along its way to terminating at a redistribution contact pad 254. A typical semiconductor die 200 will have a plurality of die contact pads 252 that will be connected to a conductive trace 250. In some embodiments, some of the die contact pads 252 will be connected to conductive traces 250 and other die contact pads 252 will have conductive balls formed upon them. This is possible when conductive balls are formed upon die contact pads 252 that are sufficiently spaced apart from each other. Meanwhile, the remaining die contact pads 252 are connected to conductive traces 250 so that conductive balls can be formed on their respective redistribution contact pads 254. However, in other embodiments, conductive traces 250 are connected to every die contact pad 252 with conductive balls formed on the respective redistribution contact pads 254. In these embodiments, conductive balls are not formed on any of the die contact pads 252.

In some embodiments, redistribution contact pads 254 have a larger width than that of each conductive trace 250 in order to more easily support a conductive ball formation such as a solder ball. Actually, redistribution contact pads 254 can have various shapes such as rectangular and/or circular. Conductive traces 250 are formed of conductive materials such as aluminum or titanium. The traces 250 can be formed of a single layer of such materials. However, traces 250 can also be formed of multiple layers of material such as, from the bottom-up, aluminum, nickel-vanadium, and copper.

Usually, underbump metallization layers are formed on top of redistribution contact pads 254 so that conductive balls are more securely joined to each redistribution contact pad 254. For example, underbump metallization is necessary when the metal of traces 250 are not solderable. It is commonly understood that solder material does not adhere to aluminum. Underbumps can be made of single or multiple layers of material. In one embodiment, an underbump metallization includes titanium, nickel-vanadium, and copper and in another embodiment an underbump metallization includes aluminum, nickel-vanadium, and copper.

Conductive traces 250 should lay flat upon the active surface of each die, across the interface between each die 200 and the surrounding working surface of support substrate 240.

Conductive traces 250 can be formed through various processes such as photolithography or stencil printing. Conductive traces formed through photolithography are formed layer by layer, lie flat upon the surfaces of the dice 200 and the support substrate 240, and have very small thicknesses and widths. Photolithographic techniques are advantageous because conductive traces can be positioned on the active and working surfaces with a high degree of precision. Traces 250 can also be formed with a high level of consistency so that better manufacturing quality and higher production yields can be achieved. Such processes are also cost effective in comparison to the wire bonding techniques used in conventional BGA packaged devices since the expense involved with using gold wires is eliminated.

Also, the thin widths of the traces allows a very high density of traces to be formed. Furthermore, since conductive traces formed through photolithography lie flat upon a surface, they are not in danger of being disconnected the way a bonding wire having a looping shape could be disconnected.

Conductive traces 250 can increase the operational performance in the resulting semiconductor device package 256 since the path-length of each conductive trace 250 is relatively short. For instance, signal transmission times and transmission interference can be minimized. The path-length of conductive traces 250 is relatively short since traces 250 only run within a single plane. The short path-length of traces 250 is particularly noteworthy in comparison to the path-length of the internal conductive traces of conventional BGA substrates that must run along a first surface of a substrate, then through an internal portion of the substrate, and then onto an opposing second surface of the substrate.

The conductive traces can also be formed in an economical manner since standard photolithography systems for semiconductor device manufacturing can be utilized. As is commonly understood, a typical metallization process using photolithography generally starts with depositing a layer of conductive material over the working surface 242 of the support substrate 240 and each of the active surfaces of dice 200. Then the layer of conductive material is coated with a photoresist material layer. The photoresist material layer is then exposed to a light source according to a desired pattern. The pattern is aimed towards defining the traces and redistributed contact pads to be formed from the conductive material layer. After exposure to light, the photoresist layer is developed such that portions of the layer are removed so that certain portions of the conductive material layer are exposed. Then, through an etching process, the exposed portions of the conductive material layer are removed. A resist stripping process is then performed to remove the photoresist remaining upon the conductive material. As a result of these processes, conductive traces with redistribution contact pads are formed upon the active surface of the dice 200 and the working surface 242 of support substrate 240. The patterning of the photoresist determines the location, size, and pattern of conductive traces 250 and their corresponding redistribution contact pads 254. It is should also be understood that various photolithography processes exist and can be used in block 110.

As discussed above, one each of each conductive trace 250 will typically be connected to a die attach pad 252 upon each die 200. Conductive traces 250 will then follow a path that leads them across an interface between a respective die 200 and the adjacent working surface 242 of support substrate 240. Again, the interface at which an active surface of a die 200 meets the adjacent working surface 242 should be substantially flat and continuous so that the photolithography process can create a solid and unbroken trace of conductive material across such an interface. As mentioned above, interfaces that are not sufficiently flat and continuous can be filled in with a filler material. After crossing the interface between a die 200 and working surface 242, each conductive trace 250 terminates at a location formed upon working surface 242. Typically, each conductive trace 250 terminates with an enlarged region that forms redistribution contact pad 254. The path along which each conductive trace 250 follows depends upon the pattern used to space apart each of redistribution contact pads 254 so that conductive balls, such as solder balls, can be formed upon redistribution contact pads 254. As seen in FIG. 6, conductive traces 250 can extend from every edge of a die 200. However, in alternative embodiments, conductive traces 250 can extend from any one or more of the edges of each die 200.

Underbump pads can also be formed upon redistribution contact pads 254 using photolithography processes. Conductive balls can then be formed upon the underbump pads using various techniques such as screen-printing, individual ball bumping processes, and electroplating processes. Typically, conductive balls are formed of a solder material.

Passivation processes are typically employed during the photolithography process to protect the surfaces of each die 200 and the conductive traces 250.

Figure 8:
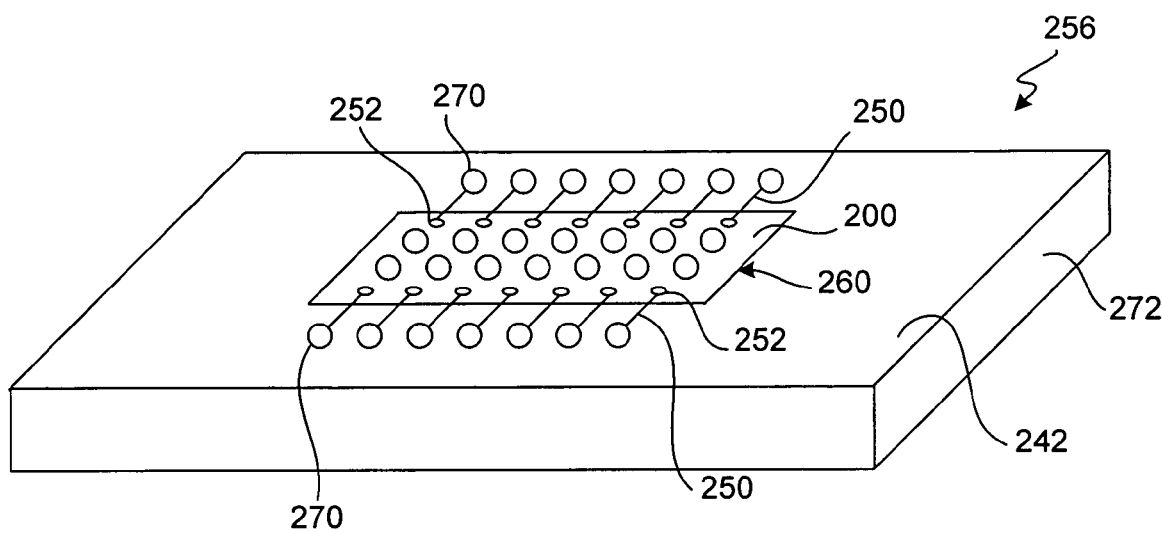
FIG. 8 illustrates a perspective view of a single semiconductor device package according to one embodiment of the present invention.

Block 112 represents one of the final stages of manufacturing process 100 wherein the individual semiconductor device packages 256 are singulated from (or "cut out of") support substrate 240. One technique for singulating semiconductor device packages 256 is to cut each package 256 out from support substrate 240 using a circular saw. FIG. 8 illustrates a perspective view of a single semiconductor device package 256 according to one embodiment of the present invention. Semiconductor device package 256 includes a die 200 that is partially embedded within a molding material 272. The active surface of die 200 is exposed through working surface 242 of molding material 272 and has conductive traces 250 that run from die contact pads on die 200, across interface 260 between die 200 and working surface 242, and terminate at a location upon working surface 242. Conductive balls 270 are formed upon the terminating ends of conductive traces 250. Conductive balls 270 are also formed upon the two inner rows of die contact pads of die 200. Note that in some embodiments, such as that shown in FIG. 8, conductive balls are formed on some of the die contact pads since they may have enough separation between them to accommodate a conductive ball. Therefore, no conductive traces 250 are connected to these die contact pads. Note that the top and bottom row of die contact pads 252 are connected to conductive traces 250, which lead to redistributed contact pads that are spaced apart from each other to accommodate conductive balls. In an alternative embodiment, a die contact pad can support a conductive ball and be connected to a conductive trace 250.

As should be understood, the number of die contact pads, the size of die 200, and the number and pattern of conductive traces 250 is dependent upon various design requirements for semiconductor devices. In some embodiments, molding material 272 can support multiple die 200 such that packaged device 256 is a multiple device package.

The manufacturing process of the present invention advantageously allows semiconductor dice of any size to have its die contact pads connected to conductive bumps to form a BGA package. Semiconductor dice of various sizes can be embedded within a support substrate and then connected to redistribution contact pads as discussed above. Additionally, the resulting size of the semiconductor device package is easily modified by changing such factors as the spacing between each die, the patterns of conductive traces utilized, and the size at which each packaged device is singulated from a support substrate.

While this invention has been described in terms of several preferred embodiments, there are alteration, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. A semiconductor device comprising:
    a semiconductor die having an active surface and at least one die contact pad formed on the active surface;
    a substrate having a working surface, the substrate being formed about the die such that at least a portion of the active surface of the die is exposed through the substrate and is adjacent to and substantially coplanar with the working surface of the substrate; and
    a conductive trace having a first end that is formed upon the active surface of the die and that is connected to a die contact pad and a second end formed upon the working surface of the substrate and forming a redistribution contact pad.

2. A semiconductor device as recited in claim 1 wherein the conductive trace lies flat upon the active surface of the die and the working surface of the substrate.

3. A semiconductor device as recited in claim 1 further comprising a plurality of conductive traces and a plurality of die contact pads wherein the distance between two redistribution contact pads is greater than the distance between two die contact pads, whereby the distance between the redistribution contact pads allows a conductive ball to be formed on top of each redistribution contact pad without interference from an adjacent conductive ball.

4. A semiconductor device as recited in claim 3 further comprising:
    an underbump pad formed on each of the redistribution contact pads; and
    a redistribution conductive ball formed on top of each underbump pad.

5. A semiconductor device as recited in claim 4 further comprising:
    at least one die conductive ball formed on top of a die contact pad.

6. A semiconductor device as recited in claim 1 further comprising:
- a crack formed at the interface between the active surface of the die and the working surface of the substrate; and
- a filler material that fills the crack such a surface of the filler material allows the interface between the active surface and the working surface to be substantially flat.

7. A semiconductor device as recited in claim 1 wherein the working surface of the substrate surrounds the active surface of the die.

8. A semiconductor manufacturing component comprising:
- a plurality of semiconductor dice that each have an active surface, each active surface having a plurality of die contact pads;
- a substrate having a working surface, the substrate being formed about each die such that the active surface of each die is exposed through the substrate and is substantially coplanar with the working surface of the substrate; and
- a plurality of conductive traces that each have a first end that is formed upon the active surface of a respective die and that is connected to a die contact pad and a second end formed upon the working surface of the substrate and forming a redistribution contact pad.

9. A semiconductor manufacturing component as recited in claim 8 wherein the working surface of the substrate is substantially flat.

10. A semiconductor manufacturing component as recited in claim 9 wherein the substrate has a wafer shape.

11. A semiconductor manufacturing component as recited in claim 9 wherein the distance between two redistribution contact pads is greater than the distance between two die contact pads, whereby the distance between the redistribution contact pads allows a conductive ball to be formed on top of each redistribution contact pad without interference from an adjacent conductive ball.

12. A semiconductor manufacturing component as recited in claim 11 further comprising:
- an underbump pad formed on each of the redistribution contact pads; and
- a redistribution conductive ball formed on top of each underbump pad.

13. A semiconductor device as recited in claim 12 further comprising:
- a die conductive ball formed on top of a die contact pad of each die.

14. A semiconductor manufacturing component as recited in claim 9 wherein the semiconductor dice a arranged in the substrate within an array of rows and columns.

* * * * *

UNITED STATES PATENT AND TRADEMARK OFFICE
CERTIFICATE OF CORRECTION

| | |
|---|---|
| PATENT NO. | : 7,061,123 B1 |
| APPLICATION NO. | : 10/838899 |
| DATED | : June 13, 2006 |
| INVENTOR(S) | : Chee et al. |

It is certified that error appears in the above-identified patent and that said Letters Patent is hereby corrected as shown below:

In line 2 of claim 14 (column 12, line 24) change "a arranged" to --are arranged--.

Signed and Sealed this

Twenty-third Day of January, 2007

JON W. DUDAS
*Director of the United States Patent and Trademark Office*